United States Patent
Fujii

(10) Patent No.: US 9,780,746 B1
(45) Date of Patent: Oct. 3, 2017

(54) N-STACKED FIELD EFFECT TRANSISTOR BASED TRAVELING WAVE POWER AMPLIFIER FOR MONOLITHIC MICROWAVE INTEGRATED CIRCUITS

(71) Applicant: MACOM Technology Solutions Holdings, Inc., Lowell, MA (US)

(72) Inventor: Kohei Fujii, San Jose, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 15/097,700

(22) Filed: Apr. 13, 2016

(51) Int. Cl.
  *H03F 3/60* (2006.01)
  *H03F 3/193* (2006.01)
  *H03F 3/213* (2006.01)
  *H03F 1/22* (2006.01)
  *H03F 1/02* (2006.01)
  *H03F 1/07* (2006.01)

(52) U.S. Cl.
  CPC ............ *H03F 3/607* (2013.01); *H03F 3/193* (2013.01); *H03F 3/213* (2013.01); *H03F 1/0288* (2013.01); *H03F 1/07* (2013.01); *H03F 1/22* (2013.01); *H03F 1/223* (2013.01); *H03F 3/60* (2013.01); *H03F 2200/153* (2013.01); *H03F 2200/61* (2013.01); *H03F 2200/75* (2013.01)

(58) Field of Classification Search
  CPC .......... H03F 3/607; H03F 3/193; H03F 3/213; H03F 1/0288; H03F 3/60; H03F 3/605

USPC ............... 330/54, 124 R, 286, 295, 311
  See application file for complete search history.

(56) References Cited

U.S. PATENT DOCUMENTS

| | | | |
|---|---|---|---|
| 6,137,367 A | 10/2000 | Ezzedine et al. | 330/311 |
| 6,768,380 B2 * | 7/2004 | Hong | H03F 3/607 330/311 |
| 7,936,210 B2 | 5/2011 | Robinson et al. | 327/581 |
| 8,487,706 B2 * | 7/2013 | Li | H03F 1/223 330/311 |
| 8,576,009 B2 | 11/2013 | Lender, Jr. et al. | 330/286 |
| 8,686,790 B2 | 4/2014 | Safavi-Naeini et al. | 330/54 |
| 8,907,722 B2 | 12/2014 | Tatsumi et al. | 330/54 |
| 9,425,752 B2 * | 8/2016 | Benson | |

OTHER PUBLICATIONS

Johansen, Tom K. et al., "Millimeter-Wave INP DHBT Power Amplifier Based on Power-Optimized Cascode Configuration", Microwave and Optical Technology Letters, vol. 55, No. 5, May 2013, pp. 1178-1182.

(Continued)

*Primary Examiner* — Khanh V Nguyen
(74) *Attorney, Agent, or Firm* — Christopher P. Maiorana, PC

(57) ABSTRACT

An apparatus includes an input port, an output port, and a plurality of amplifier stages connected in parallel between the input port and the output port. Each of the amplifier stages comprises a common source field effect transistor (CSFET) and at least two common gate field effect transistors (CGFETs) coupled in series with a drain of the common source FET. At least one of the common gate field effect transistors of each stage includes a stabilizing network connected between drain and source diffusions.

20 Claims, 6 Drawing Sheets

(56) References Cited

OTHER PUBLICATIONS

Van Waasen, Stefan et al., "27-GHz Bandwidth High-Speed Monolithic Integrated Optoelectronic Photoreceiver Consisting of a Waveguide Fed Photodiode and an InAlAs/InGaAs-HFET Traveling Wave Amplifier", IEEE Journal of Solid-State Circuits, vol. 32, No. 9, Sep. 1997, pp. 1394-1401.
"Distributed Amplifier", Wikipedia, https://en.wikipedia.org/wiki/Distributed_amplifier, Aug. 8, 2015, 4 pages.

* cited by examiner

US 9,780,746 B1

N-STACKED FIELD EFFECT TRANSISTOR BASED TRAVELING WAVE POWER AMPLIFIER FOR MONOLITHIC MICROWAVE INTEGRATED CIRCUITS

FIELD OF THE INVENTION

The present invention relates to microwave and millimeter-wave power amplifiers generally and, more particularly, to a method and/or apparatus for implementing an N-stacked field effect transistor (FET) based traveling wave power amplifier for monolithic microwave integrated circuits.

BACKGROUND OF THE INVENTION

In many microwave and millimeter-wave (mm-wave) radio applications, high power broadband amplifier monolithic microwave integrated circuits (MMICs) are needed. To provide high power broadband amplifier MMICs, traveling wave amplifier (TWA) MMICs have been commonly used. To increase output power, two-stacked FET configurations have been widely used. Theoretically, the stacked FET configuration can be extended to configurations with three or more stacked FETs. However, when making configurations with more than two stacked FETs, amplifier stability seriously deteriorates at the highest operational frequency due to non-ideal common source grounding. Because of the instability issue, high power TWAs have been exclusively designed using the 2-stacked FET configuration. The 2-stacked FET configuration is only able to increase the operational drain voltage by a factor of two when compared with the conventional TWA.

It would be desirable to implement an N-stacked field effect transistor (FET) based traveling wave power amplifier for monolithic microwave integrated circuits.

SUMMARY OF THE INVENTION

The present invention concerns an apparatus includes an input port, an output port, and a plurality of amplifier stages connected in parallel between the input port and the output port. Each of the amplifier stages comprises a common source field effect transistor (CSFET) and at least two common gate field effect transistors (CGFETs) coupled in series with a drain of the common source FET. At least one of the common gate field effect transistors of each stage includes a stabilizing network connected between drain and source diffusions.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the invention include providing an N-stacked field effect transistor (FET) based traveling wave power amplifier for monolithic microwave integrated circuits that may (i) use an N-stacked FET configuration with N greater than two for a high power traveling wave amplifier (TWA), (ii) utilize a stabilizing CR network between drain and source diffusions in at least one common gate FET of each stage in the TWA, (iii) provide improved gain and port matching for operational frequencies from zero to about 45 GHz, and/or (iv) be implemented in a monolithic microwave integrated circuit (MMIC).

Figure 1:
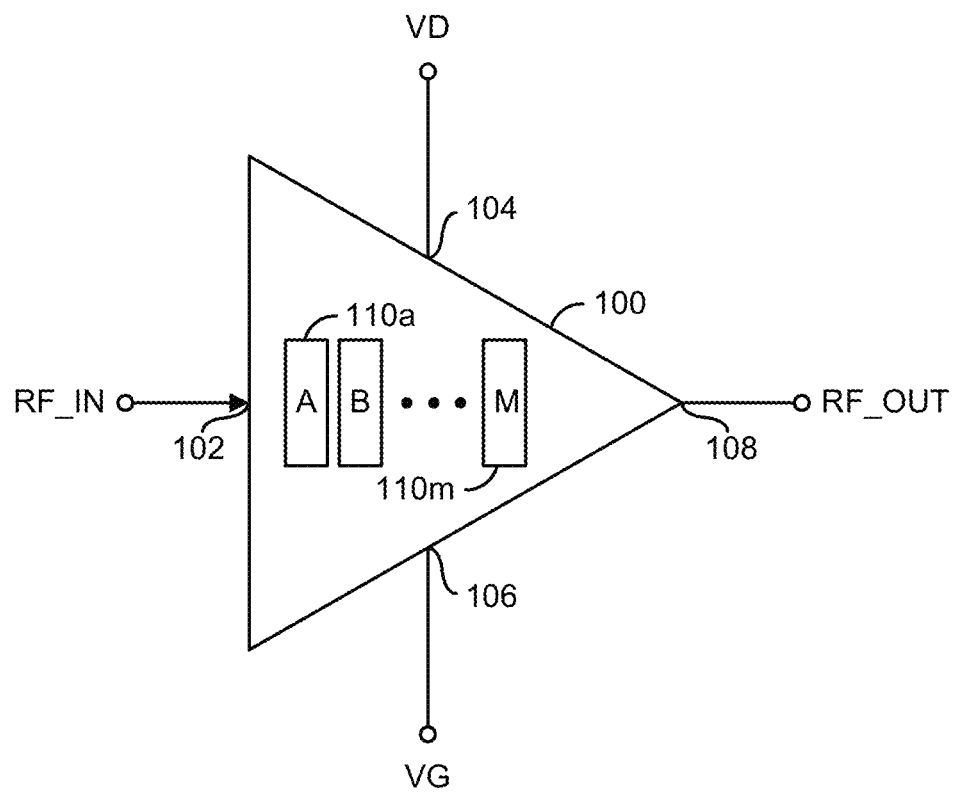
FIG. 1 is a diagram illustrating a power amplifier in accordance with an example embodiment of the invention.

Referring to FIG. 1, a diagram of a circuit 100 is shown illustrating an amplifier circuit in accordance with an example embodiment of the invention. In various embodiments, the circuit 100 may have a first input 102, a second input 104, a third input 106, and an output 108. The first input 102 may be configured to receive a radio frequency (RF) input signal (e.g., RF_IN). The second input 104 and the third input 106 may be configured to receive bias signals (e.g., VD and VG, respectively). The output 108 may be configured to present an RF output signal (e.g., RF_OUT). The output signal RF_OUT is generally an amplified version of the input signal RF_IN (e.g., RF_OUT=K*RF_IN, where K represents a gain of the circuit 100).

In various embodiments, the circuit 100 implements a distributed or traveling wave amplifier (TWA) comprising a number (e.g., M) of stages (or cells) 110a-110m. Each of the stages 110a-110m may be implemented using an N-stacked field effect transistor (FET) configuration, where N is an integer greater than 2. Each of the stages 110a-110m includes an integrated stabilizing network in accordance with an example embodiment of the invention. The terms M and N are used to represent integer values for the number of amplifier stages and the number of stacked FETs, respectively. The values M an N may be the same or different.

Figure 2:
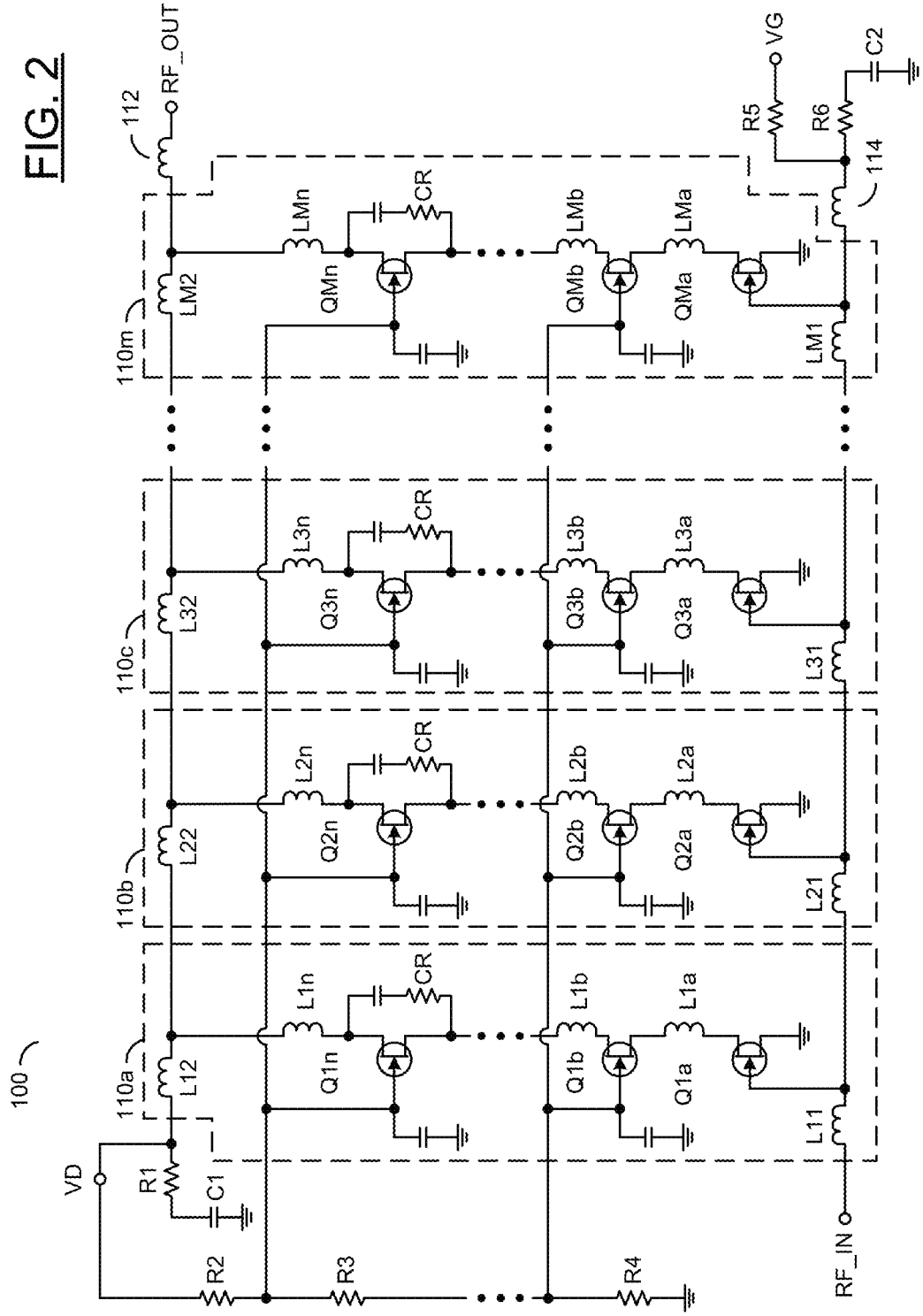
FIG. 2 is a diagram illustrating an equivalent circuit for an N-stacked field effect transistor (FET) traveling wave amplifier (TWA) with integrated stabilizing networks in accordance with an example embodiment of the invention.

Referring to FIG. 2, a diagram is shown illustrating an equivalent circuit representation of the circuit 100 implemented as an N-stacked FET TWA with integrated CR stabilizing networks in accordance with an example embodiment of the invention. In various embodiments, the circuit 100 may comprise an M stage cascode distributed or traveling wave amplifier. In various embodiments, each of the stages 110a-110m of the circuit 100 includes a first FET (e.g., Q1a, Q2a, . . . , QMa, respectively) and a number of second FETs (e.g., Q1b-Q1n, Q2b-Q2n, . . . , QMb-QMn, respectively). The first FETs Q1a, Q2a, . . . , QMa are arranged in a common source configuration. The second FETs Q1b-Q1n, Q2b-Q2n, . . . , QMb-QMn are arranged in a common gate configuration. A source of each of the FETs Q1a, Q2a, . . . , QMa is coupled to a circuit ground potential. A gate of each of the FETs Q1a, Q2a, . . . , QMa is coupled to a gate transmission line including impedances L11, L21, L31, . . . , LM1. In various embodiments, the impedances of the gate transmission line may be implemented using a microstrip line and/or a coplanar wave guide structure.

A drain of each of the FETs Q1a, Q2a, . . . , QMa is coupled to a source of the FETs Q1b, Q2b, . . . , QMb by impedances L1a, L2a, . . . , LMa, respectively. A number of impedances L1b-L1(n−1), L2b-L2(n−1), . . . , and LMb-LM (n−1) couple respective drains and sources of the FETs Q1b-Q1n, Q2b-Q2n, . . . , QMb-QMn of each stage 110a-110m in series. A gate of each of the FETs Q1b-Q1n, Q2b-Q2n, . . . , QMb-QMn is DC coupled to a respective reference potential and AC coupled to the circuit ground potential by a respective decoupling capacitor. A drain of each of the FETs Q1n, Q2n, . . . , QMn is coupled to a drain transmission line including impedances L12, L22, L32, . . . , and LM2. In various embodiments, the impedances of the drain transmission line may be implemented using a microstrip line and/or a coplanar wave guide structure.

The drain transmission line is terminated on one end in a resistor R1 which couples the drain transmission line to the circuit ground potential through a capacitor C1. The other end of the drain transmission line is coupled to an RF output of the circuit 100 by an impedance 112. The bias signal VD is presented to a node formed by the connection of the drain transmission line and the resistor R1. The bias signal VD is also presented to a voltage divider formed by resistors R2, R3, . . . , and R4. The number of resistors in the voltage divider is determined by the number N of stacked FETs in each stage 110a-110m. The voltage divider produces the respective reference potentials presented to the gates of the FETs Q1b-Q1n, Q2b-Q2n, . . . , QMb-QMn. The gate transmission line coupled to the FETs Q1a, Q2a, . . . , QMa is coupled to the RF input of the circuit 100 via a terminal of the impedance L11, and terminated in an impedance 114 which couples the gate transmission line to the circuit ground potential through a resistor R6 and a capacitor C2. The bias signal VG is applied to the gate transmission line through a resistor R5 which is coupled to the impedance 114 and the resistor R6.

In various embodiments, stabilizing networks are coupled between the drains and sources of each of the FETs Q1n, Q2n, . . . , QMn. The stabilizing networks are integrated into the structures of the FETs Q1n, Q2n, . . . , QMn. In an example, the stabilizing networks comprise a series connected capacitance and resistance (CR). As is apparent, the configuration for the circuit 100 includes M essentially identical cascade amplifier stages 110a-110m. The cascade amplifier stages 110a-110m basically assure that the gate electrodes of the FETs Q1b-Q1n, Q2b-Q2n, . . . , QMb-QMn are partially grounded through a gate-to-source capacitance (e.g., Cgs) equivalent value. Therefore, at the highest operational frequency, gate termination impedance is not low enough, which results in gain peaking at the highest operation frequency. This design improves broadband frequency range. The stabilizing CR networks in accordance with the invention prevent stability issues at the highest operational frequency due to partial termination design of the common gate termination for operational band improvement.

Figure 3:
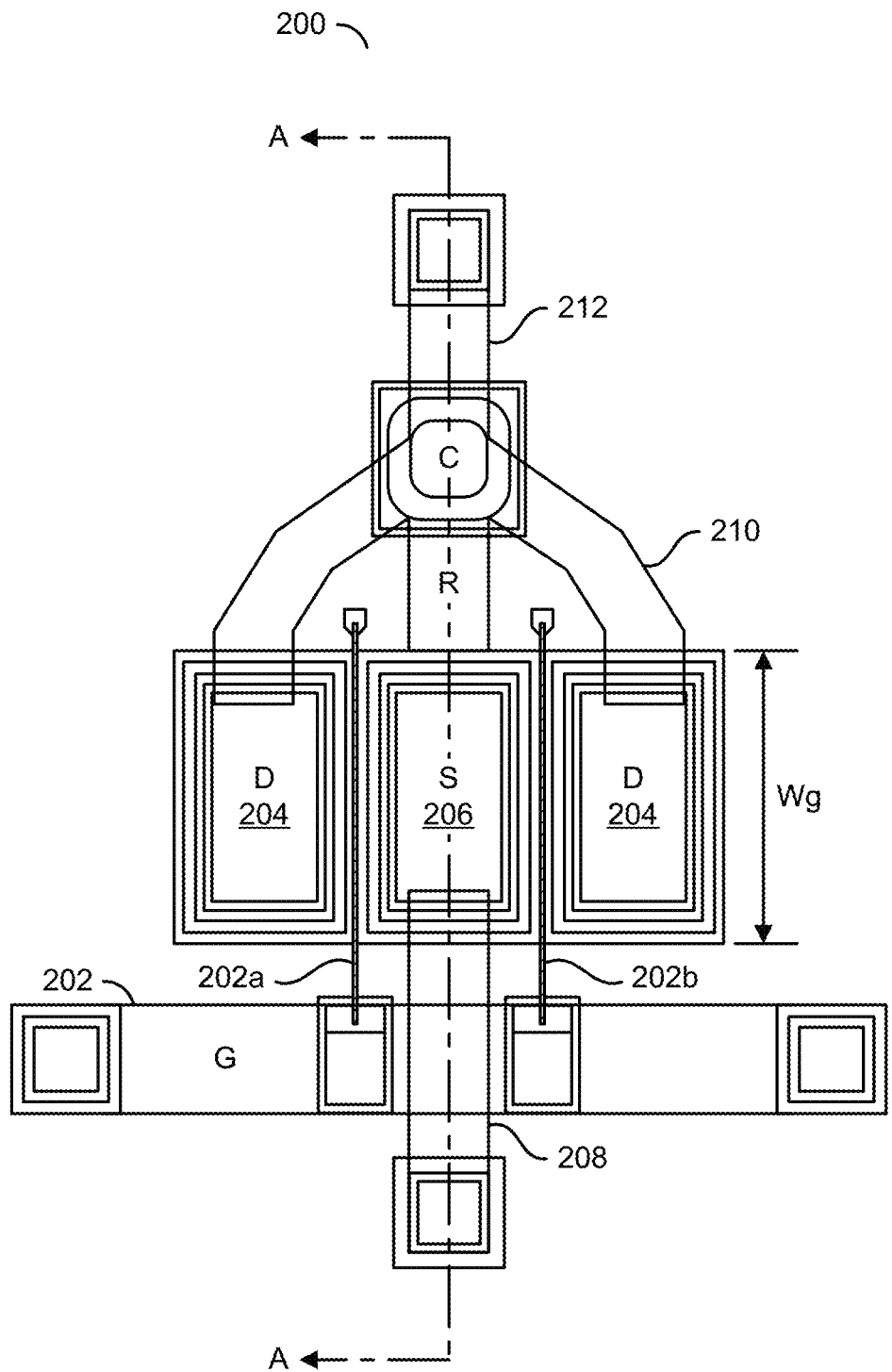
FIG. 3 is a diagram illustrating an example layout of a field effect transistor with integrated CR stabilizing network in accordance with an example embodiment of the invention.

Referring to FIG. 3, a diagram is shown illustrating an example layout of a field effect transistor (FET) 200 with an integrated stabilizing network in accordance with an example embodiment of the invention. In various embodiments, the FET 200 may be implemented in at least one of gallium arsenide (GaAs), gallium nitride (GaN), indium phosphide (InP), bipolar junction transistor (BJT), heterojunction bipolar transistor (HBT), high electron mobility transistor (HEMT), and pseudomorphic high electron mobility transistor (pHEMT) technologies. However, other semiconductor technologies may be utilized to meet the design criteria of a particular application.

In an example, the FET 200 is implemented as a two-finger HEMT, the most basic transistor used in a frequency range up to at least 50 GHz. The stabilizing technique in accordance with the invention may be applied to any size FET. In an example, the FET 200 may be implemented with a gate width (Wg) of 50 microns. In another example, a high power version of the FET 200 may be implemented with a gate width (Wg) of 760 microns. The two-finger HEMT is essentially a parallel combination of two transistors side-by-side. A gate line 202 below the two-finger HEMT 200 feeds two very thin gate fingers 202a and 202b. The gate fingers 202a and 202b control two channel currents flowing from two drain pads 204 to a central common source pad 206. A common source line 208 is connected to the common source pad 206. The drain pads 204 are connected to a drain combiner 210, which also connects with a drain line 212. In various embodiments, the common source line 208 and the drain combiner 210 are implemented as air bridge or equivalent structures. For example, the common source line 208 and the drain combiner 210 are generally insulated from lower structures by air or an insulator other than air (e.g., silicon dioxide ($SiO_2$), silicon nitride (SiN or $SiN_x$), etc.).

In various embodiments, the integrated stabilizing network comprises a capacitor (C) and a resistor (R) connected in series between the drain combiner 210 and the source pad 206. In various embodiments, the capacitor C and resistor R may be implemented as a metal-insulator-metal (MIM) capacitor and a MESA resistor, respectively. In some embodiments, the capacitor C is implemented with a value of 0.03 pF. In some embodiments, the resistor R is implemented with a value of 300 ohms.

In various embodiments, the transistor 200 may be used to implement the top common gate transistors (e.g., Qxn) in each stage 110a-110m of the circuit 100, where x indicates the stage number. However, use of the transistor 200 in the circuit 100 is not limited to the top common gate FETs. In various embodiments, the transistor 200 may be used to implement one or more of the common gate transistors in each stage including or not including the top common gate transistors Qxn. In embodiments using the transistor 200 as the top common gate FET in each stage of the circuit 100, the source line 210 and the drain line 212 may be used to implement the inductors Ln and L(n−1) connecting the transistors in the series stack. In such embodiments, the source line 210 and the drain line 212 may be implemented using a microstrip line and/or a coplanar wave guide structure.

Figure 4:
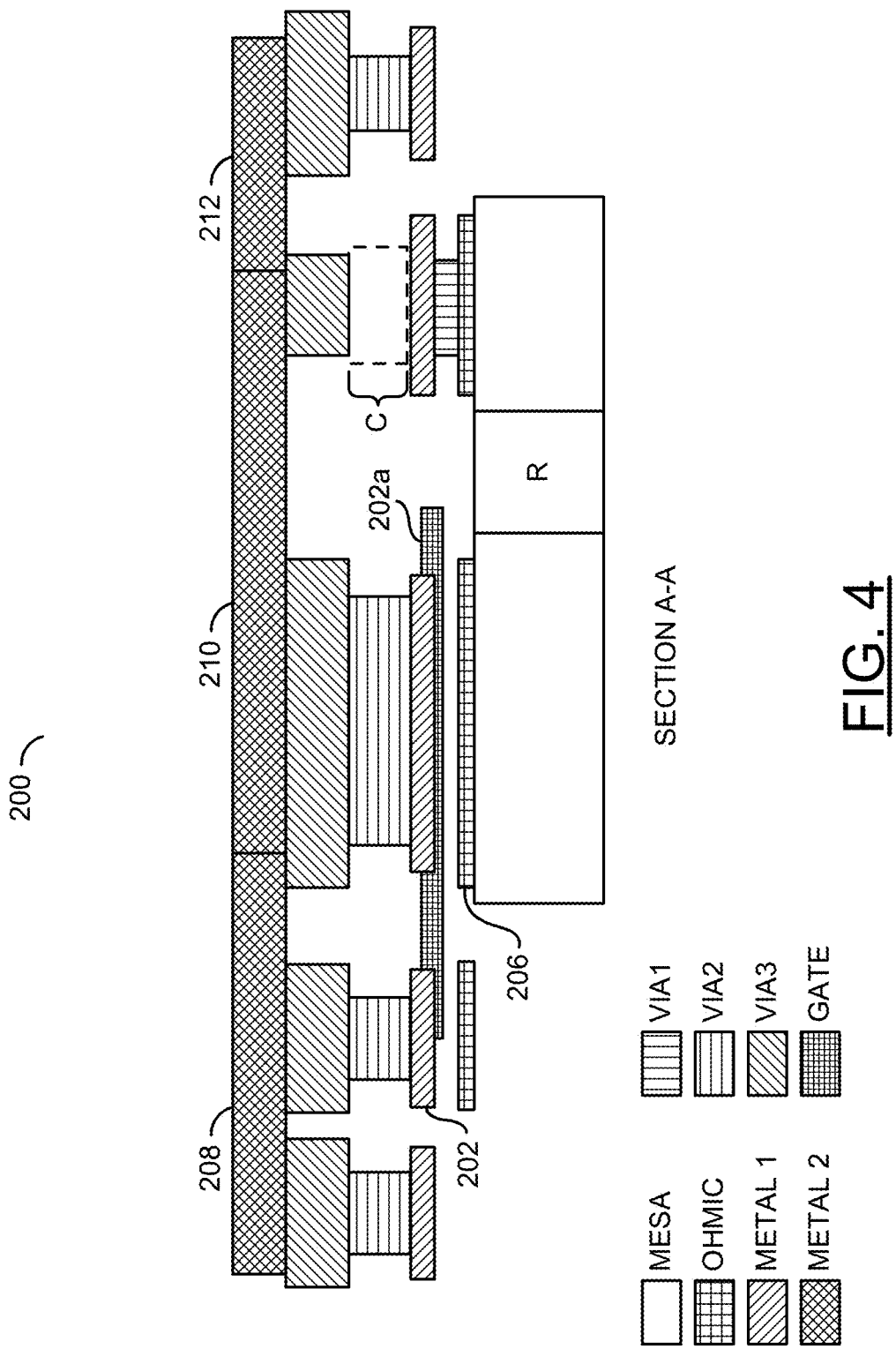
FIG. 4 is a cross-sectional view of the field effect transistor layout of FIG. 3.

Referring to FIG. 4, a cross-sectional view is shown illustrating a number of layers of the transistor layout 200 of FIG. 3 along a section line A-A. The layers illustrated are generally disposed on a top surface of a substrate (not shown). A bottom surface of the substrate may have a backside metal layer deposited thereon (not shown). In various embodiments, a mesa is formed in a first layer on the top surface of the substrate. The mesa includes a mesa resistor R. An Ohmic layer is patterned on the first layer. The patterning of the Ohmic layer includes a portion that is part of the source pad 206. A first silicon nitride passivation layer is deposited on the Ohmic layer. A Metal1 layer and a Gate layer are formed on the first silicon nitride passivation layer. The gate finger 202a is formed in the Gate layer. The first silicon nitride passivation layer prevents connection between the Ohmic layer and the Metal1 and Gate layers.

A Via1 layer defines an inter-connection between the Ohmic and Metal1 layers. A second silicon nitride layer (or second nitride layer) is deposited above the METAL1 layer. In an example, the second nitride layer may have a thickness of approximately 0.15 um. A Via2 layer and a Via3 layer are formed to define inter-connections between the Metal1 layer and a Metal2 layer. In an example, the Via2 layer may have a thickness of approximately 0.15 um, identical to the second silicon nitride layer. The second silicon nitride layer generally defines the metal-insulator-metal (MiM) capacitor C. In an example, an air layer (~1.5 um thick) is formed above the second nitride layer. The Via3 layer over the MiM capacitor C defines the capacitor top which defines the capacitance value. The Metal2 layer is deposited on top of the other layers. The Metal2 layer forms connections between parts of the transistor 200 and between the transistor 200 and other devices (e.g., other transistors) formed on the substrate.

Figure 5:
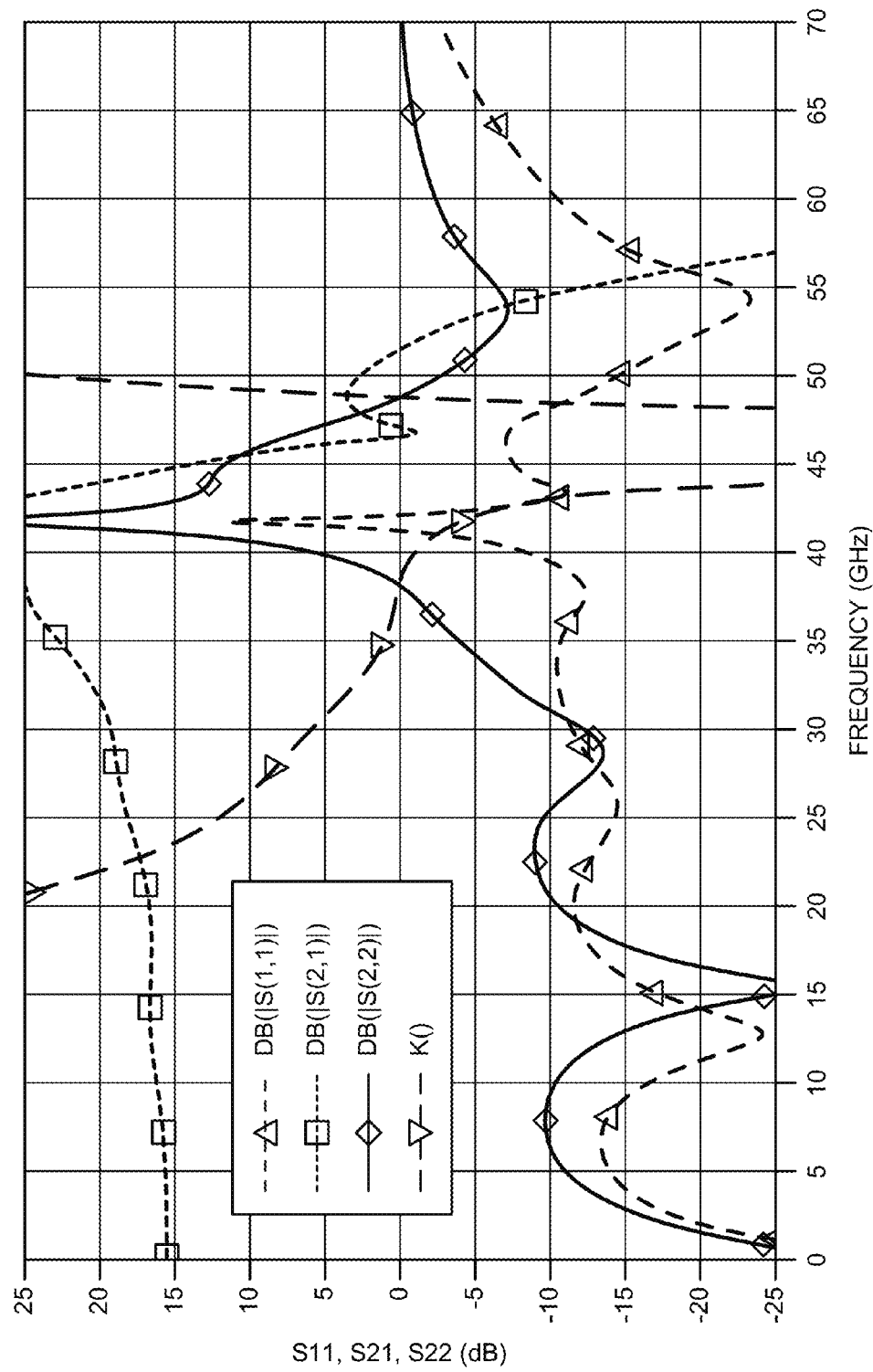
FIG. 5 is a diagram illustrating simulation results for a 3-stacked FET based TWA without a stabilizing network.

Referring to FIG. 5, a diagram is shown illustrating S-parameter, S(1,1), S(2,1), S(2,2), simulation results for a 3-stacked FET-based TWA without integrated stabilizing networks as shown in FIG. 2. FIG. 5 clearly shows that a 3-stacked FET based TWA without the integrated stabilizing networks has a serious stability issue. The positive S11 and S22 values are clear evidence that far more than input RF power is returned from the amplifier.

Figure 6:
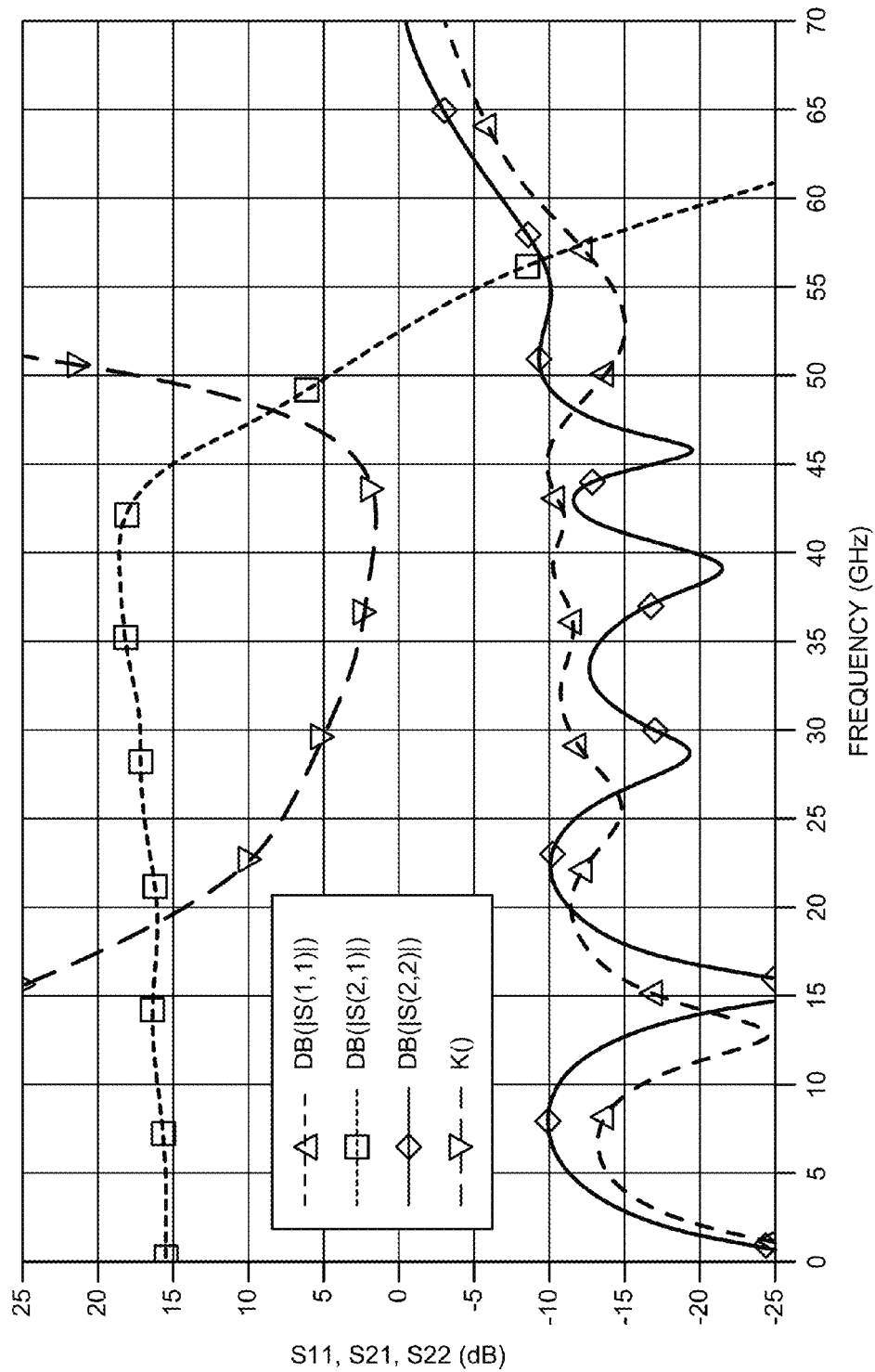
FIG. 6 is a diagram illustrating simulation results for a 3-stacked FET based TWA with a stabilizing network in accordance with an example embodiment of the invention.

Referring to FIG. 6, a diagram is shown illustrating S-parameter, S(1,1), S(2,1), S(2,2), simulation results for a 3-stacked FET-based TWA with stabilizing CR networks in accordance with an example embodiment of the invention. As is apparent in FIG. 5, implementation of the integrated stabilizing networks in the 3-stacked FET-based TWA provides very nice gain and port matching for operational frequencies from zero to 45 GHz.

The functions and structures illustrated in the diagrams of FIGS. 1 to 6 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   an input port;
   an output port; and
   a plurality of amplifier stages connected in parallel between the input port and the output port, wherein (i) each of the amplifier stages comprises a common source field effect transistor (CSFET) and at least two common gate field effect transistors (CGFETs) coupled in series with a drain of the common source FET, (ii) at least one of the common gate field effect transistors of each stage includes an integrated stabilizing network comprising a capacitor and a resistor connected in series between a drain combiner and a source pad, and (iii) the integrated stabilizing network is integrated within the at least one common gate field effect transistor.

2. The apparatus according to claim 1, wherein:
   the capacitor of said integrated stabilizing network comprises a metal-insulator-metal capacitor; and
   the resistor of said integrated stabilizing network comprises a mesa resistor.

3. The apparatus according to claim 1, wherein the plurality of amplifier stages form an N-stacked FET traveling wave amplifier (TWA), with N being an integer greater than 2.

4. The apparatus according to claim 3, wherein the traveling wave amplifier has a bandwidth ranging from DC to about 45 GHz.

5. The apparatus according to claim 1, wherein the plurality of amplifier stages are disposed on a monolithic microwave integrated circuit.

6. The apparatus according to claim 1, wherein the apparatus is part of a microwave or mm-wave power amplifier.

7. The apparatus according to claim 1, wherein the field effect transistors are implemented in at least one of gallium arsenide (GaAs), gallium nitride (GaN), indium phosphide (InP), bipolar junction transistor (BJT), heterojunction bipolar transistor (HBT), high electron mobility transistor (HEMT), and pseudomorphic high electron mobility transistor (pHEMT) technologies.

8. The apparatus according to claim 1, wherein each of the transistors in the amplifier stage are coupled using at least one of a microstrip line and a coplanar wave guide structure.

9. The apparatus according to claim 1, wherein the amplifier stages are coupled using at least one of a microstrip line and a coplanar wave guide structure.

10. The apparatus according to claim 1, wherein the common source field effect transistor (CSFET) and the at least two common gate field effect transistors (CGFETs) of each stage form a cascode amplifier stage.

11. A method of amplifying a radio frequency signal comprising:
   disposing a plurality of amplifier stages connected in parallel between an input port and an output port, wherein each of the amplifier stages comprises a common source field effect transistor (CSFET) and at least two common gate field effect transistors (CGFETs) coupled in series with a drain of the common source FET; and
   disposing an integrated stabilizing network within a layout of at least one the common gate field effect transistors of each stage, wherein said integrated stabilizing network comprises a capacitor and a resistor connected in series between a drain combiner and a source pad of the at least one of the common gate field effect transistors of each stage.

12. The method according to claim 11, wherein:
   the capacitor of said integrated stabilizing network comprises a metal-insulator-metal capacitor; and
   the resistor of said integrated stabilizing network comprises a mesa resistor.

13. The method according to claim 11, wherein the plurality of amplifier stages form an N-stacked FET traveling wave amplifier (TWA), with N being an integer greater than 2.

14. The method according to claim 13, wherein the traveling wave amplifier has a bandwidth ranging from DC to about 45 GHz.

15. The method according to claim 11, wherein the plurality of amplifier stages are disposed on a monolithic microwave integrated circuit.

16. The method according to claim 11, wherein the radio frequency signal comprises a microwave or mm-wave signal.

17. The method according to claim 11, wherein the field effect transistors are formed using at least one of gallium arsenide (GaAs), gallium nitride (GaN), indium phosphide (InP), bipolar junction transistor (BJT), heterojunction bipolar transistor (HBT), high electron mobility transistor (HEMT), and pseudomorphic high electron mobility transistor (pHEMT) technologies.

18. The method according to claim 11, further comprising coupling each of the transistors in the amplifier stage in series using at least one of a microstrip line and a coplanar wave guide structure.

19. The method according to claim 11, further comprising coupling each of the amplifier stages in parallel using at least one of a microstrip line and a coplanar wave guide structure.

20. The method according to claim 11, wherein the common source field effect transistor (CSFET) and the at least two common gate field effect transistors (CGFETs) of each stage form a cascode amplifier stage.

\* \* \* \* \*